United States Patent
Suess et al.

(10) Patent No.: US 12,294,802 B2
(45) Date of Patent: May 6, 2025

(54) LOW POWER EVENT DRIVEN PIXELS WITH ACTIVE DIFFERENCE DETECTION CIRCUITRY, AND RESET CONTROL CIRCUITS FOR THE SAME

(71) Applicant: OMNIVISION TECHNOLOGIES, INC., Santa Clara, CA (US)

(72) Inventors: Andreas Suess, San Jose, CA (US); Shoushun Chen, Shanghai (CN)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 338 days.

(21) Appl. No.: 17/875,244

(22) Filed: Jul. 27, 2022

(65) Prior Publication Data
US 2024/0040283 A1 Feb. 1, 2024

(51) Int. Cl.
*H04N 25/771* (2023.01)
*H03F 3/16* (2006.01)
(Continued)

(52) U.S. Cl.
CPC ............ *H04N 25/771* (2023.01); *H03F 3/16* (2013.01); *H04N 25/42* (2023.01); *H04N 25/709* (2023.01); *H03K 19/20* (2013.01)

(58) Field of Classification Search
CPC .... H04N 25/771; H04N 25/42; H04N 25/709; H04N 25/47; H04N 25/707; H04N 25/77;
(Continued)

(56) References Cited

U.S. PATENT DOCUMENTS 6,476,864 B1 * 11/2002 Borg ............... H04N 25/63
348/241
7,719,583 B1 * 5/2010 Lee ................ H04N 25/77
348/308
(Continued)

FOREIGN PATENT DOCUMENTS

CN 101123671 A 2/2008
CN 113572990 A 10/2021
(Continued)

OTHER PUBLICATIONS

L. Wu et al., "In-Pixel Storage Techniques for CMOS Burst-Mode Ultra-High-Speed Imagers," Vrije Universiteit Brussel (VUB), Dept. of Electronics and Informatics (ETRO), Brussels, Belgium, pp. 312-312.
(Continued)

*Primary Examiner* — Mekonnen D Dagnew
(74) *Attorney, Agent, or Firm* — Perkins Coie LLP; Daniel L. Jackstadt (57) ABSTRACT

Low power event driven pixels and reset control circuits for the same are disclosed herein. In one embodiment, an event driven pixel comprises a photosensor; a photocurrent-to-voltage converter coupled to the photosensor; and a difference circuit coupled to the photocurrent-to-voltage converter. The difference circuit includes a source follower transistor and is configured to generate a signal at a gate of the source follower transistor that is based on a voltage output from the photocurrent-to-voltage converter. The difference circuit is further configured to output a difference signal in response to assertion of a row select signal. The event driven pixel can further include a reset control circuit coupled to the difference circuit and configured to initialize the difference circuit, and to reset the difference circuit when the difference signal output from the event driven pixel
(Continued)

indicates a change in the voltage greater than a threshold amount.

32 Claims, 4 Drawing Sheets

(51) Int. Cl.
  *H04N 25/42* (2023.01)
  *H04N 25/709* (2023.01)
  *H03K 19/20* (2006.01)
(58) Field of Classification Search
  CPC .. H04N 25/40; H03F 3/16; H03F 3/70; H03F 2200/264; H03K 19/20
  See application file for complete search history.

(56) References Cited

U.S. PATENT DOCUMENTS

| | | | | |
|---|---|---|---|---|
| 8,610,615 | B2* | 12/2013 | Kawahito | H03M 1/0827 341/161 |
| 8,780,240 | B2 | 7/2014 | Posch et al. | |
| 9,961,291 | B2 | 5/2018 | Chen | |
| 11,212,457 | B2 | 12/2021 | Dai et al. | |
| 11,240,454 | B2* | 2/2022 | Gao | H04N 25/47 |
| 11,357,299 | B1 | 6/2022 | Kim | |
| 11,430,828 | B2 | 8/2022 | Gao et al. | |
| 11,729,534 | B1 | 8/2023 | Suess et al. | |
| 2017/0353683 | A1* | 12/2017 | Sakakibara | H04N 25/616 |
| 2021/0344867 | A1* | 11/2021 | Gao | H04N 25/75 |
| 2022/0149864 | A1* | 5/2022 | Prakash | H03M 3/458 |
| 2022/0201236 | A1 | 6/2022 | Gao et al. | |
| 2022/0239855 | A1* | 7/2022 | Spiessens | H10F 39/803 |
| 2022/0239858 | A1 | 7/2022 | Dai et al. | |
| 2022/0321811 | A1* | 10/2022 | Myers | H03F 3/45632 |

FOREIGN PATENT DOCUMENTS

| | | |
|---|---|---|
| EP | 3563564 B1 | 12/2021 |
| TW | 202112121 A | 3/2021 |

OTHER PUBLICATIONS

L. Wu et al., "Analysis and Design of a CMOS Ultra-High-Speed Burst Mode Imager with In-Situ Storage Topology Featuring In-Pixel CDS Amplification," Department of Electronics and informatics (ETRO), Vrije Universiteit Brussel, 1050 Brussels, Belgium, Sep. 23, 2018, 17 pages.
S. Ranganathan et al., "Discrete-Time Parametric Amplification Based on a Three-Terminal MOS Varactor: Analysis and Experimental Results," IEEE Journal of Solid-State Circuits, vol. 38, No. 12, Dec. 2003, 7 pages.
A. Suess et al., U.S. Appl. No. 17/875,240, filed Jul. 27, 2022, 42 pages.
A. Suess et al., U.S. Appl. No. 17/815,526, filed Jul. 27, 2022, 47 pages.
Wu et al., "In-Pixel Storage Techniques for CMOS Burst-Mode Ultra-High-Speed Imagers," Vrije Universiteit Brussel (VUB), Dept. of Electronics and Informatics (ETRO), Brussels, Belgium, 2017, p. 312-315.
Notice of Allowance, Low Power Event Driven Pixels With Passive Difference Detection Circuitry, and Reset Control Circuits for the Same, U.S. Appl. No. 17/875,240, filed Jul. 22, 2022, Mail Date: Mar. 29, 2023, pp. 1-18.
Notice of Allowance, Low Power Event Driven Pixels With Passive, Differential Difference Detection Circuitry, and Reset Control Circuits for the Same, U.S. Appl. No. 17/815,526, filed Jul. 22, 2022, Mail Date: Feb. 23, 2024, pp. 1-9.

* cited by examiner

LOW POWER EVENT DRIVEN PIXELS WITH ACTIVE DIFFERENCE DETECTION CIRCUITRY, AND RESET CONTROL CIRCUITS FOR THE SAME

TECHNICAL FIELD

This disclosure relates generally to image sensors. For example, several embodiments of the present technology relate to event driven pixels, including low power event driven pixels with active difference detection circuitry, and reset control circuits for the same.

BACKGROUND

Image sensors have become ubiquitous and are now widely used in digital cameras, cellular phones, security cameras, as well as medical, automobile, and other applications. As image sensors are integrated into a broader range of electronic devices, it is desirable to enhance their functionality, performance metrics, and the like in as many ways as possible (e.g., resolution, power consumption, dynamic range, etc.) through both device architecture design as well as image acquisition processing.

A typical image sensor operates in response to image light from an external scene being incident upon the image sensor. The image sensor includes an array of pixels having photosensitive elements (e.g., photodiodes) that absorb a portion of the incident image light and generate image charge upon absorption of the image light. The image charge photogenerated by the pixels may be measured as analog output image signals on column bitlines that vary as a function of the incident image light. In other words, the amount of image charge generated is proportional to the intensity of the image light, which is read out as analog image signals from the column bitlines and converted to digital values to provide information that is representative of the external scene.

BRIEF DESCRIPTION OF THE DRAWINGS

Non-limiting and non-exhaustive embodiments of the present technology are described below with reference to the following figures, in which like or similar reference characters are used to refer to like or similar components throughout unless otherwise specified.

Skilled artisans will appreciate that elements in the figures are illustrated for simplicity and clarity and are not necessarily drawn to scale. For example, the dimensions of some of the elements in the figures may be exaggerated relative to other elements to aid in understanding of various aspects of the present technology. In addition, common but well-understood elements or methods that are useful or necessary in a commercially feasible embodiment are often not depicted in the figures or described in detail below to avoid unnecessarily obscuring the description of various aspects of the present technology.

DETAILED DESCRIPTION

The present disclosure relates to event driven sensors. For example, several embodiments of the present technology are directed to event driven pixels, including low power event driven pixels with active difference detection circuitry and/ or to event driven pixels with reset control circuits. In the following description, specific details are set forth to provide a thorough understanding of aspects of the present technology. One skilled in the relevant art will recognize, however, that the systems, devices, and techniques described herein can be practiced without one or more of the specific details set forth herein, or with other methods, components, materials, etc.

Reference throughout this specification to an "example" or an "embodiment" means that a particular feature, structure, or characteristic described in connection with the example or embodiment is included in at least one example or embodiment of the present technology. Thus, use of the phrases "for example," "as an example," or "an embodiment" herein are not necessarily all referring to the same example or embodiment and are not necessarily limited to the specific example or embodiment discussed. Furthermore, features, structures, or characteristics of the present technology described herein may be combined in any suitable manner to provide further examples or embodiments of the present technology.

Spatially relative terms (e.g., "beneath," "below," "over," "under," "above," "upper," "top," "bottom," "left," "right," "center," "middle," and the like) may be used herein for ease of description to describe one element's or feature's relationship relative to one or more other elements or features as illustrated in the figures. It will be understood that the spatially relative terms are intended to encompass different orientations of a device or system in use or operation, in addition to the orientation depicted in the figures. For example, if a device or system illustrated in the figures is rotated, turned, or flipped about a horizontal axis, elements or features described as "below" or "beneath" or "under" one or more other elements or features may then be oriented "above" the one or more other elements or features. Thus, the exemplary terms "below" and "under" are non-limiting and can encompass both an orientation of above and below. The device or system may additionally, or alternatively, be otherwise oriented (e.g., rotated ninety degrees about a vertical axis, or at other orientations) that illustrated in the figures, and the spatially relative descriptors used herein are interpreted accordingly. In addition, it will also be understood that when an element is referred to as being "between" two other elements, it can be the only element between the two other elements, or one or more intervening elements may also be present.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

A. OVERVIEW

An active pixel sensor commonly employs an array of pixels having an integration time that is globally defined. Thus, pixels in an array of an active pixel sensor typically have an identical integration time, and each pixel in the array is typically converted into a digital signal regardless of its content (e.g., regardless of whether there has been a change in an external scene that was captured by a pixel since the last time the pixel was read out).

In comparison, event driven sensors (e.g., event vision sensors or dynamic vision sensors) read out a pixel and/or convert a corresponding pixel signal into a digital signal only when the pixel captures a change (e.g., an event) in the external scene. In other words, pixels of an event driven sensor that do not detect a change in the external scene are not read out and/or pixel signals corresponding to such pixels are not converted into digital signals. Thus, each pixel of an event driven sensor can be independent from other pixels of the event driven sensor, and only pixels that detect a change in the external scene need be read out, and/or have their corresponding pixel signals converted into digital signals and/or recorded (thereby saving power).

Many event driven pixels include local amplification and comparators for event threshold detection. The amplification and comparator circuits of each event driven pixel typically require DC bias currents on the order of nano-amperes, resulting in milliwatts of power consumption in mega-pixel event driven sensors regardless of whether there are any events that occur in an external scene. In other words, the current power consumption of many event driven pixels make such event driven pixels unsuitable for use with battery-operated, always-on event driven sensors in which sub-milliwatt power consumption of the event driven sensors is desired (e.g., for prolonged battery life).

Some event driven pixels (a) measure, without amplification in the output stage, a voltage generated based on photocurrent output from a photosensor and (b) include a common-source gm-stage to make up for the lack of signal amplification in the output stage. Use of a common-source gm-stage is expected to lead to excessive non-uniformity, increased non-linearity, challenges in setting an operating point properly for all event driven pixels of an event driven sensor, and/or challenges in calibrating an event driven pixel. In addition, because signal amplification only occurs after the output stage, the noise performance of event driven pixels using a common-source gm-stage is expected to be inferior to the event driven sensors described above.

To address these concerns, several event driven pixels of the present technology each include (a) a photosensor configured to generate photocurrent in response to incident light received from an external scene, (b) a photocurrent-to-voltage converter coupled to the photosensor to convert the photocurrent to a voltage, and (c) a difference circuit coupled to the photocurrent-to-voltage converter and configured to generate a difference signal or analog signal level (e.g., a logarithmic difference voltage relative to a reset time) based at least in part on the voltage. In some embodiments, the difference circuit can include a source follower buffer or transistor. Including a source follower buffer in the difference circuit is expected to (a) yield improved uniformity and/or linearity, and/or (b) improve the dynamic response of the event driven pixel, especially in comparison to event driven pixels that employ a common-source amplifier to re-introduce gain. In these and other embodiments, an event driven pixel of the present technology can include event threshold detection on a column level (a) to reduce static power consumption of the event driven pixel and/or (b) to implement frame-based readout of the event driven pixel. In addition, the difference circuit can include an amplifier configured to provide signal amplification at the output stage. The amplifier can be configured to receive an enable signal to selectively enable (or disable) the amplifier for power savings. For example, the amplifier can be powered down at times when the event driven pixel is not outputting the analog signal level (e.g., when a frame is not being read out), thereby reducing power consumption of the event driven pixel.

Including signal amplification at the output stage is expected (in comparison with event driven pixels that do not include signal amplification at the output stage or only include signal amplification at stages occurring later than the output stage) to (a) decrease non-uniformity, non-linearity, and/or other challenges in properly setting an operating point for the event driven pixel or in calibrating the event driven pixel, and/or (b) improve noise performance. In turn, the event driven pixel is expected (in comparison with event driven pixels that do not include signal amplification at the output stage or only include signal amplification at stages occurring later than the output stage) to reduce false positive and/or false negative event detections, and therefore to reduce unnecessary wakeups or image/video transfers of an image sensor including the event driven pixel. In addition, power consumption of the event driven pixel is reduced as the amplifier of the difference circuit can be powered down at times when the amplifier is not in use. Thus, event driven pixels of the present technology are expected to provide reduced power consumption while achieving a high gain and low noise performance.

In these and other embodiments, a photocurrent-to-voltage converter of the present technology can include an amplifier. The amplifier of the photocurrent-to-voltage converter can be employed to increase a response speed of a change of the voltage output from the photocurrent-to-voltage converter. In other words, the amplifier can be employed in low-latency applications to increase the speed with which the difference circuit of the event driven pixel produces the analog signal level based on the voltage output from the photocurrent-to-voltage converter. Similar to the amplifier of the difference circuit described above, the amplifier of the photocurrent-to-voltage converter can be configured to receive an enable signal to selectively enable (or disable) the amplifier for power savings. For example, the amplifier of the photocurrent-to-voltage converter can be powered down at times when the event driven pixel is not outputting the analog signal level (e.g., when a frame is not being read out), thereby reducing the power consumption of the event driven pixel.

In these and still other embodiments, event driven pixels of the present technology include a reset control circuit. The reset control circuit can be configured to (a) initialize the event driven pixel in response to assertion of a global reset signal and/or (b) reset the event driven pixel when an analog signal level is read out from the event driven pixel (e.g., in response to assertion of a row select signal) and the analog signal level indicates an event has occurred within an external scene (e.g., resulting in assertion of an acknowledge signal). In some embodiments, when the event driven pixel is initialized or reset by the reset control circuit, the input and the output of the amplifier of the difference circuit can be shorted together to auto-zero the amplifier. As such, offset variation can be largely or entirely canceled in event driven pixels of the present technology. Additionally, or alternatively, event driven pixels of the present technology can utilize capacitor matching between several capacitors of the difference circuit to reduce, minimize, or eliminate gain error of the difference circuit. Therefore, event driven pixels of the present technology are expected to be suitable in use with battery-operated, always-on event driven sensors while avoiding several of the challenges discussed above and observed in many event driven pixels.

B. SELECTED EMBODIMENTS OF LOW POWER EVENT DRIVEN PIXELS, RESET CONTROL CIRCUITS, AND ASSOCIATED SYSTEMS, DEVICES, AND METHODS

Figure 1:
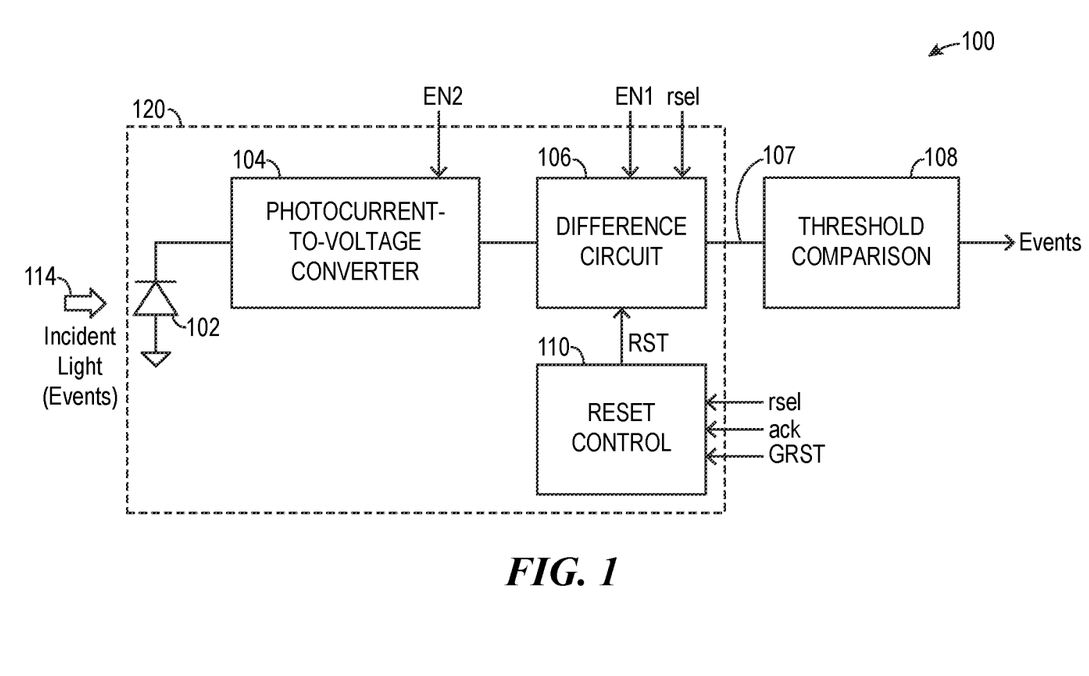
FIG. 1 is a partial schematic block diagram of an imaging system including an event driven pixel, each configured in accordance with various embodiments of the present technology.

FIG. 1 is a partial schematic block diagram of an imaging system 100 configured in accordance with various embodiments of the present technology. As shown, the imaging system 100 includes an event driven pixel 120 and a threshold comparison circuit 108. The threshold comparison circuit 108 can be incorporated into the event driven pixel 120 in other embodiments of the present technology.

The event driven pixel 120 of FIG. 1 includes a photosensor 102, a photocurrent-to-voltage converter 104, a difference circuit 106, and a reset control circuit 110. The photosensor 102 is illustrated as a photodiode in FIG. 1 having an anode coupled to ground (e.g., a negative power supply rail or another reference voltage) and a cathode coupled to the photocurrent-to-voltage converter 104. In operation, the photosensor 102 of FIG. 1 is configured to photogenerate charge or photocurrent in response to incident light 114 received from an external scene. In other embodiments of the present technology, the photosensor 102 may be another suitable type of photosensor or photodetector (e.g., a metal-semiconductor-metal (MSM) photodetector, a phototransistor, a photoconductive detector, or a phototube).

The photocurrent-to-voltage converter 104 of FIG. 1 is coupled to the photosensor 102 and is configured to convert photocurrent generated by the photosensor 102 to a voltage. The difference circuit 106 is coupled to the photocurrent-to-voltage converter 104. Based on a voltage received from the photocurrent-to-voltage converter 104, the difference circuit 106 is configured to (a) sample a reference signal or voltage when the event driven pixel 120 is reset and (b) generate a difference signal or voltage (e.g., an analog signal level) relative to the reference signal (e.g., relative to a last time the event driven pixel 120 was reset). When a row select signal rsel is asserted, the difference circuit 106 can output the difference signal onto a bit or column line 107. More specifically, the difference circuit 106 can output the difference signal to the threshold comparison circuit 108 via the column line 107.

In some embodiments, the difference circuit 106 can be configured to receive an enable signal EN. Additionally, or alternatively, the photocurrent-to-voltage converter 104 can be configured to receive an enable signal EN2. As discussed in greater detail below, the enable signal EN and/or the enable signal EN2 can be used to selectively enable (e.g., power up, such as turn on, enable current flow, or force into a higher power mode or state) or disable (e.g., power down, such as shut off, disable current flow, or force into a lower power mode or state) one or more amplifiers of the difference circuit 106 and/or of the photocurrent-to-voltage converter 104, respectively. Disabling the amplifiers is expected to reduce power consumption of the event driven pixel 120, thereby reducing power consumption of the imaging system 100 and/or an image sensor (not shown) incorporating the imaging system 100.

The reset control circuit 110 controls reset of the event driven pixel 120. More specifically, the reset control circuit 110 receives a global reset signal GRST, the row select signal rsel, and an acknowledge signal ack. As discussed in greater detail below, the reset control circuit is configured, based on assertion of the global reset signal GRST, the row select signal rsel, and/or the acknowledge signal ack, to (a) generate a reset signal RST and (b) initiate sampling of a new reference signal generated by the difference circuit 106 in response to assertion of the reset signal RST.

The threshold comparison circuit 108 is coupled to an output of the difference circuit 106. In the illustrated embodiment, the threshold comparison circuit 108 is a circuit peripheral to the event driven pixel 120 and is coupled to the event driven pixel 120 via the column line 107. Placement of the threshold comparison circuit 108 on the column line 107 such that the threshold comparison circuit 108 is shared amongst the event driven pixel 120 and other event driven pixels (not shown) coupled to the column line 107 is expected to reduce static power consumption in comparison to event driven pixels incorporating dedicated threshold comparison circuits.

In operation, the threshold comparison circuit 108 is configured to detect events that occur within the external scene. More specifically, when an event occurs in the external scene, the event is indicated in the incident light 114 that is received by the photosensor 102 as a quick or sudden change in intensity or brightness. In other words, if the external scene is static such that no event is occurring, the brightness of the incident light 114 remains substantially unchanged. As such, the photocurrent generated by the photosensor 102 remains substantially constant. If, however, an event (e.g., movement) occurs within the external scene, the event is indicated with an asynchronous quick or sudden change in the brightness of the incident light 114 received by the photosensor 102. The change in brightness can be from darker to brighter or from brighter to darker. Thus, there can be an asynchronous change in the photocurrent generated by the photosensor 102 that, in turn, can result in a change in the difference signal generated by the difference circuit 106. Therefore, the threshold comparison circuit 108 can be configured to receive the difference signal from the difference circuit 106, compare the difference signal to a threshold value or amount, and detect events that occur in the external scene based on the comparison. For example, the threshold comparison circuit 108 can detect that an event has occurred in the external scene when a magnitude of the difference signal output by the difference circuit 106 exceeds a magnitude of a threshold value.

When the threshold comparison circuit 108 detects an event, the acknowledge signal ack can be asserted to prompt the reset control circuit 110 to (a) assert the reset signal RST to reset the event driven pixel 120 and (b) initiate sampling of a new reference voltage. Additionally, or alternatively, the threshold comparison circuit 108 can output event information (e.g., where an event is detected, such as the x-y coordinates of the photosensor 102 in a pixel array used to detect the event; the polarity of change in the photocurrent for that event (e.g., brighter or darker); and/or a time the event occurred) for recording. On the other hand, when the threshold comparison circuit 108 does not detect an event, the acknowledge signal ack can be left unasserted such that (absent assertion of the global reset signal GRST) the event driven pixel 120 is not reset by the reset control circuit 110, and the difference circuit 106 continues to generate a difference signal based on the formerly sampled reference voltage.

It is noted that an image sensor incorporating the imaging system 100 of FIG. 1 does not need to record an entire regular image, and therefore is not burdened with having to capture all of the highly redundant information of a normal image from frame to frame. Instead, the image sensor can record only event information. In other words, outside of threshold comparison performed by threshold comparison circuits 108, the image sensor can ignore portions of frames of images or videos in which no event was detected, thereby enabling ultra-high frame rates and/or ultra-high-speed capabilities with a low data rate. In some embodiments, an event may be read out synchronously or asynchronously. In these and other embodiments, event data from the event driven pixel 120 may be combined with a normal image or video capture to reconstruct a high-frame-rate, high-quality image or video with event detection via software, an artificial intelligence (AI) network, or other suitable technology.

Figure 2:
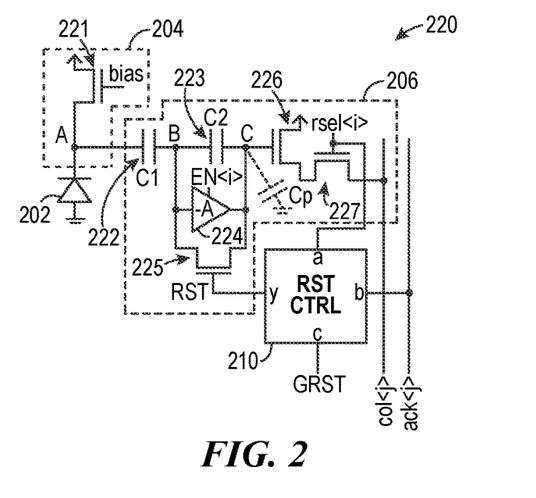
FIG. 2 is a partial schematic diagram of an event driven pixel configured in accordance with various embodiments of the present technology.

FIG. 2 is a partial schematic diagram of an event driven pixel 220 configured in accordance with various embodiments of the present technology. As shown, the event driven pixel 220 includes a photosensor 202, a photocurrent-to-voltage converter 204, a difference circuit 206, and a reset control circuit 210. The event driven pixel 220 can be the event driven pixel 120 of FIG. 1 (e.g., such that the photosensor 202, the photocurrent-to-voltage converter 204, the difference circuit 206, and/or the reset control circuit 210 of FIG. 2 are the photosensor 102, the photocurrent-to-voltage converter 104, the difference circuit 106, and/or the reset control circuit 110 of FIG. 1, respectively), or the event driven pixel 220 can be another event driven pixel of the present technology.

The photosensor 202 includes an anode coupled to ground (e.g., a negative power supply rail or another reference voltage) and a cathode. The photocurrent-to-voltage converter 204 of the event driven pixel 220 is coupled to the cathode of the photosensor 202 to convert photocurrent generated by the photosensor 202 to a voltage. More specifically, the photocurrent-to-voltage converter 204 is configured to generate an output at node A that has a logarithmic relation with the intensity of incident light received by the photosensor 202 from an external scene. In the illustrated embodiment, the photocurrent-to-voltage converter 204 includes a transistor 221 having (a) a source coupled to the cathode of the photosensor 202 and (b) a drain coupled to a supply voltage (e.g., a positive power supply rail or another reference voltage). A gate of the transistor 221 is coupled to a bias voltage. It is appreciated that the photocurrent-to-voltage converter 204 may have another schematic configuration in other embodiments of the present technology than the schematic configuration shown in FIG. 2, and that the other schematic configuration can provide an output voltage that is responsive to the intensity of incident light received by the photosensor 202 from the external scene. Examples of alternative schematic configurations of the present technology that can be used in addition to or in lieu of the photocurrent-to-voltage converter 204 of FIG. 2 are discussed in detail below with reference to FIGS. 9-11.

With continuing reference to FIG. 2, the difference circuit 206 of the event driven pixel 220 is coupled to the output of the photocurrent-to-voltage converter 204. In the illustrated embodiment, the difference circuit 206 includes a first capacitor C1 222, a second capacitor C2 223, an amplifier 224, a reset transistor 225, a source follower buffer or transistor 226, and a row select transistor 227. The amplifier 224 of the difference circuit 206 includes an input (e.g., an inverting input) and an output. In some embodiments, the amplifier 224 can be an opamp and/or can further include another input (not shown), such as a non-inverting input, that is coupled to ground (e.g., a negative power supply rail or another reference voltage). The first capacitor C1 222 is coupled between an output of the photocurrent-to-voltage converter 204 (e.g., node A) and the input of the amplifier 224 (e.g., node B), and the second capacitor C2 223 is coupled between the input of the amplifier 224 (e.g., node B) and the output of the amplifier 224 (e.g., node C). The reset transistor 225 is arranged as a reset switch and is also coupled between the input of the amplifier 224 (e.g., node B) and the output of the amplifier 224 (e.g., node C). Thus, the second capacitor C2 223, the amplifier 224, and the reset transistor 225 are arranged in parallel in FIG. 2 between node B and node C. As discussed in greater detail below, a gate of the reset transistor 225 is configured to receive a reset signal RST output from the reset control circuit 210.

The first capacitor C1 222, the second capacitor C2 223, the amplifier 224, and/or the reset transistor 225 form a filter amplifier that is configured to generate a filtered and amplified signal in response to a voltage output by the photocurrent-to-voltage converter 204 at node A. More specifically, the filter amplifier of the difference circuit 206 includes a high pass filter that is configured to filter out lower frequency components from the voltage received from the photocurrent-to-voltage converter 204. Thus, the event driven pixel 220 can ignore slow or gradual changes in the photocurrent generated by the photosensor 202 in response to incident light from an external scene, and can instead detect quick or sudden changes that occur in the photocurrent generated by the photosensor 202 in response to the incident light. As discussed in greater detail below, the filter amplifier of FIG. 2 can generate a reference signal or voltage at node C that is applied to a gate of the source follower transistor 226.

A drain of the source follower transistor 226 is coupled to a supply voltage (e.g., a positive power supply rail or another reference voltage), and a source of the source follower transistor 226 is coupled to a drain of the row select transistor 227. In some embodiments, the source follower transistor 226 is a linear source follower buffer. A source of the row select transistor 227 is coupled to a column line col<j>, and a gate of the row select transistor 227 is configured to receive a row select signal rsel<i>. Thus, based on the signal at node C applied to the gate of the source follower transistor 226, the source follower transistor 226 and the row select transistor 227 can output a difference signal on the column line col<j> when the row select signal rsel<i> applied to the gate of the row select transistor 227 is asserted. As discussed in greater detail below, the difference signal can be a result of a comparison between (a) the reference signal at the gate of the source follower transistor 226 and (b) the voltage at node A at a moment of assertion of the row select signal rsel<i>.

As shown in FIG. 2, the amplifier 224 of the difference circuit 206 is configured to receive an enable signal EN<i>. The enable signal EN<i> can be used to selectively enable or disable the amplifier 224. For example, as discussed above and in greater detail below, the event driven pixel 220 is configured to output an analog signal level on the column line col<j> in response to assertion of the row select signal rsel<i>. In other words, the event driven pixel 220 of FIG. 2 can implement frame-based readout (e.g., in addition to or in lieu of asynchronous readout). Thus, the enable signal EN<i> can be used to selectively disable or place the amplifier 224 in a powered-down mode (thereby reducing power consumption of the event driven pixel 220) at times when the event driven pixel 220 is not outputting the difference signal onto the column line col<j>, and can selectively enable or place the amplifier 224 in a powered-up mode at times when the event driven pixel 220 is expected to output the difference signal onto the column line col<j> (e.g., when the row select signal rsel<i> is asserted).

Figure 3:
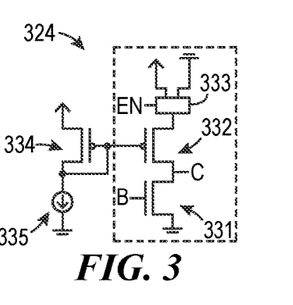
FIGS. 3-5 are partial schematic diagrams of amplifiers configured in accordance with various embodiments of the present technology.
Figure 4:
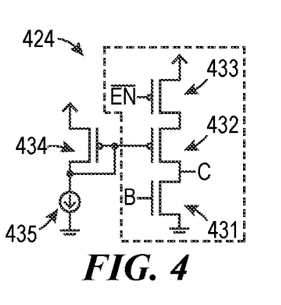
Figure 5:
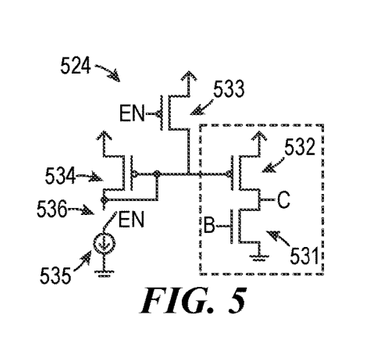

FIGS. 3-5 are partial schematic diagrams of amplifiers 324, 424, and 524 respectively, that can be implemented as the amplifier 224 of FIG. 2 in various embodiments of the present technology. Referring first to FIG. 3, the amplifier 324 includes (a) a first transistor 331, (b) a second transistor 332, (c) a power supply switch component 333, (d) a third transistor 334, and (e) a current source 335. In some embodiments, each of these components form part of the event driven pixel 220 of FIG. 2. In other embodiments, a subset of these components form part of the event driven pixel 220 while the remaining components can be positioned outside of (e.g., on the periphery) of the event driven pixel 220. As a specific example, the first transistor 331, the second transistor 332, and the power supply switch component 333 illustrated within the dashed box in FIG. 3 can form part of the event driven pixel 220, and the third transistor 334 and the current source 335 can be peripheral circuitry positioned outside of the event driven pixel 220.

As shown, the first transistor 331 is an NMOS transistor, the second transistor 332 is a PMOS transistor, and the third transistor 334 is a PMOS transistor. The first transistor 331 has a gate coupled to node B of FIG. 2, a source coupled to ground, and a drain coupled to a drain of the second transistor 332 and to node C of FIG. 2. A gate of the second transistor 332 is coupled to a gate of the third transistor 334, and a source of the second transistor 332 is coupled to an output of the power supply switch component 333. The drain of the second transistor 332 is also coupled to node C of FIG. 2.

The second transistor 332 is driven by a bias potential that is generated at the gate of the second transistor 332 by the third transistor 334 and the current source 335. More specifically, the third transistor 334 has a source coupled to a supply voltage (e.g., a positive power supply rail or another reference voltage), and a drain coupled to the current source 335 and to the gates of the second and third transistors 332 and 334. Thus, the third transistor 334 operates as a matched diode-connected PMOS transistor forming a current mirror with the second transistor 332 and the current source 335. The second transistor 332, third transistor 334, and the current source 335 operate as an active load and limit maximum cross-current in the amplifier 324. As such, the first transistor 331 and the second transistor 332 of the amplifier 324 form a current-starved inverter in which (a) the first transistor 331 connects an input of the current-starved inverter at the gate of the first transistor 331 to an output of the current-starved inverter at the drain of the first transistor 331, and (b) the second transistor 332 forms a current-source-based active load.

The power supply switch component 333 includes a first input coupled to a supply voltage (e.g., a positive power supply rail or another reference voltage) and a second input coupled to ground. In other embodiments of the present technology, the power supply switch component 333 includes the first input coupled to the supply voltage but does not include the second input coupled to ground, and/or the power supply switch component 333 includes a second or third input that is unused (e.g., coupled to nothing). The power supply switch component 333 is configured to receive an enable signal EN (e.g., the enable signal EN<i> of FIG. 2), and to selectively couple the second transistor 332 to the supply voltage and/or to ground based on the enable signal EN. For example, the power supply switch component 333 can include a multiplexer (e.g., a 2-to-1 multiplexer, or a 3-to-1 multiplexer having the third input described above that is connected to nothing) configured to receive the enable signal EN as a select signal. Continuing with this example, the power supply switch component 333 can couple the second transistor 332 to the supply voltage when the enable signal EN is asserted, and can couple the second transistor 332 to ground or to nothing when the enable signal EN is not asserted. Thus, when the enable signal EN is not asserted, the amplifier 324 can be placed in a low power or powered down state (e.g., to conserve power, prolong battery life of an imager incorporating the event driven pixel 220 of FIG. 2, etc.). In still other embodiments of the present technology, the amplifier 324 can otherwise switch the supply voltage to be equal to the ground voltage based on the state of the enable signal EN, and/or can include a power supply switch component 333 at other locations (e.g., between ground and the source of the first transistor 331, between the drain of the second transistor 332 and node C, and/or between the drain of the first transistor 331 and node C) in addition to in lieu of including the power supply switch component 333 at the location shown in FIG. 3. In still other embodiments, the amplifier 324 can omit the power supply switch component 333, and the difference circuit 206 of the event driven pixel 220 of FIG. 2 can simply ignore the output of the amplifier 324 at node C until the row select signal rsel<i> is asserted.

Referring now to FIG. 4, the amplifier 424 includes (a) a first transistor 431, (b) a second transistor 432, (c) a third transistor 434, (d) a current source 435, and (e) a fourth transistor 433. In some embodiments, each of the components illustrated in FIG. 4 form part of the event driven pixel 220 of FIG. 2. In other embodiments, a subset of the components illustrated in FIG. 4 form part of the event driven pixel 220 while the remaining components can be positioned outside of (e.g., on the periphery) of the event driven pixel 220. As a specific example, the first transistor 431, the second transistor 432, and the fourth transistor 433 illustrated within the dashed box in FIG. 4 can form part of the event driven pixel 220, and the third transistor 434 and the current source 435 can be peripheral circuitry positioned outside of the event driven pixel 220. As shown, the amplifier 424 is similar to the amplifier 324 of FIG. 3 except that the amplifier includes the fourth transistor 433 in lieu of the power supply switch component 333 of the amplifier 333. Therefore, a detailed discussion of the first transistor 431, the second transistor 432, the third transistor 434, and the current source 435 is omitted for the sake of brevity.

The fourth transistor 433 has a source coupled to a supply voltage (e.g., a positive power supply rail or another reference voltage), and a drain coupled to a source of the second transistor 432. A gate of the fourth transistor 433 is configured to receive the logical opposite of an enable signal EN (e.g., the enable signal EN<i> of FIG. 2), and to selectively couple the second transistor 432 to the supply voltage. For example, the fourth transistor 433 can function as a switch. Thus, the fourth transistor 433 can couple the source of the second transistor 432 to the supply voltage when the enable signal EN is asserted, and can uncouple the source of the second transistor 432 from the supply voltage when the enable signal EN is not asserted. Thus, when the enable signal EN is not asserted, the amplifier 324 can be placed in a low power or powered down state (e.g., to conserve power, prolong battery life of an imager incorporating the event driven pixel 220 of FIG. 2, etc.).

Referring now to FIG. 5, the amplifier 524 includes (a) a first transistor 531, (b) a second transistor 532, (c) a third transistor 534, (d) a current source 535, (e) a fourth transistor 533, and (f) a switch 536 (or fifth transistor). In some embodiments, each of the components illustrated in FIG. 5 form part of the event driven pixel 220 of FIG. 2. In other embodiments, a subset of the components illustrated in FIG. 5 form part of the event driven pixel 220 while the remaining components can be positioned outside of (e.g., on the periphery) of the event driven pixel 220. As a specific example, the first transistor 531 and the second transistor 532 illustrated within the dashed box in FIG. 5 can form part of the event driven pixel 220, and the third transistor 534, the fourth transistor 533, the current source 535, and the switch 536 can be peripheral circuitry positioned outside of the event driven pixel 220.

As shown, the amplifier 524 is generally similar to the amplifier 324 of FIG. 3 and to the amplifier 424 of FIG. 4. For example, the first transistor 531 and the second transistor 532 of the amplifier 524 form a current-starved inverter in which (a) the first transistor 531 connects an input of the current-starved inverter at the gate of the first transistor 531 to an output of the current-starved inverter at the drain of the first transistor 531, and (b) the second transistor 532 forms a current-source-based active load. More specifically, the second transistor 532 is driven by a bias potential that is generated at a gate of the second transistor 532 by the third transistor 534 and the current source 535. Similar to the third transistors 334 and 434 of FIGS. 3 and 4, respectively, the third transistor 534 of FIG. 5 operates as a matched diode-connected PMOS transistor forming a current mirror with the second transistor 532 and the current source 535. Thus, the second transistor 532, third transistor 534, and the current source 535 operate as an active load and limit maximum cross-current in the amplifier 524.

In contrast to the amplifiers 324 and 424, the bias potential is selectively generated at the gate of the second transistor 532 based on an enable signal EN (e.g., the enable signal EN<i> of FIG. 2). In particular, the fourth transistor 533 is a PMOS transistor that includes a source coupled to a supply voltage (e.g., a positive power supply rail or another reference voltage), and a drain coupled to the gate of the second transistor 532 and a gate of the third transistor 534. In addition, the switch 536 is electrically positioned between (a) the drain and the gate of the third transistor 534 and (b) the current source 535. Thus, when the enable signal EN is asserted, the switch 536 couples the current source 535 to the drain and the gate of the third transistor 534, and the fourth transistor 533 is off. As such, the bias potential is generated at the gate of the second transistor 532 when the enable signal EN is asserted. On the other hand, when the enable signal EN is not asserted, the switch 536 uncouples the current source 535 from the drain and the gate of the third transistor 534, and activates the fourth transistor 533. As such, the gate of the second transistor 532 is coupled to the supply voltage and the second transistor 532 is off. Thus, when the enable signal EN is not asserted, the amplifier 324 can be placed in a low power or powered down state (e.g., to conserve power, prolong battery life of an imager incorporating the event driven pixel 220 of FIG. 2, etc.).

Referring again to FIG. 2, the difference circuit 206 can therefore be an active difference detector circuit that includes signal amplification at the output stage of the event driven pixel 220. As discussed above, including signal amplification at the output stage is expected (in comparison with event driven pixels that do not include signal amplification at the output stage or only include signal amplification at stages occurring later than the output stage) to (a) decrease non-uniformity, non-linearity, and/or other challenges in properly setting an operating point for the event driven pixel 220 or in calibrating the event driven pixel 220, and/or (b) improve noise performance. In turn, the event driven pixel 220 is expected (in comparison with event driven pixels that do not include signal amplification at the output stage or only include signal amplification at stages occurring later than the output stage) to reduce false positive and/or false negative event detections, and therefore to reduce unnecessary wakeups or image/video transfers of an image sensor including the event driven pixel 220. In addition, as discussed above, the amplifier 224 of the difference circuit 206 of the event driven pixel 220 can be powered down or placed in a low power state at times when the event driven pixel 220 is not outputting the difference signal onto the column line col<j>, thereby reducing the power consumption of the event driven pixel 220. Thus, the event driven pixel 220 is expected to provide reduced power consumption while achieving a high gain and low noise performance.

Furthermore, as discussed in greater detail below, the input and the output of the amplifier 224 can be shorted together via the reset transistor 225 upon assertion of the reset signal RST. This can auto-zero the amplifier 224, setting the voltage at node B equal to the voltage at node C at a mid-potential that is dependent on characteristics of the amplifier 224. As such, offset variation can be largely or entirely canceled in the event driven pixel 220. In addition, by using capacitor matching between the first capacitor C1 222 and the second capacitor C2 223 of the difference circuit 206 of the event driven pixel 220, gain error of the difference circuit 206 can be kept small.

It is appreciated that the amplifier 224 of FIG. 2 may have another schematic configuration in other embodiments of the present technology than the schematic configurations shown in FIGS. 2, 3, 4, and 5. For example, the amplifier 224 can include an NMOS/PMOS complimentary inverter (not shown) with a current source (not shown) between (a) a drain node of the NMOS transistor and a ground voltage or (b) a drain node of the PMOS transistor and a supply voltage, similar to current starving in ring oscillators. Furthermore, it is appreciated that the difference circuit 206 of FIG. 2 may have another schematic configuration in other embodiments of the present technology than the schematic configuration shown in FIG. 2.

Referring now to the reset control circuit 210 of the event driven pixel 220 of FIG. 2, the reset control circuit 210 includes a first input (input a) configured to receive the row select signal rsel<i>, a second input (input b) configured to receive an acknowledge signal ack<j>, and a third input (input c) configured to receive a global reset signal GRST. As discussed above, the row select signal rsel<i> is used to readout a difference signal from the difference circuit 206. The acknowledge signal ack<j> can be asserted when a peripheral threshold comparison circuit (e.g., the threshold comparison circuit 108 of FIG. 1) on the column line col<j> detects an event has occurred in the external scene based on the difference signal output from the difference circuit 206 in response to assertion of the row select signal rsel<i>. The global reset signal GRST can be asserted to reset the event driven pixel 220 at any time. As shown in FIG. 2, the reset control circuit 210 is configured to apply the reset signal RST to the gate of the reset transistor 225 of the difference circuit 206 via an output (output y) of the reset control circuit 210.

Figure 6:
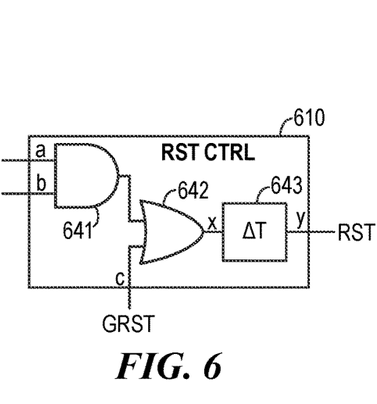
FIGS. 6 and 7 are partial schematic diagrams of reset control circuits configured in accordance with various embodiments of the present technology.
Figure 7:
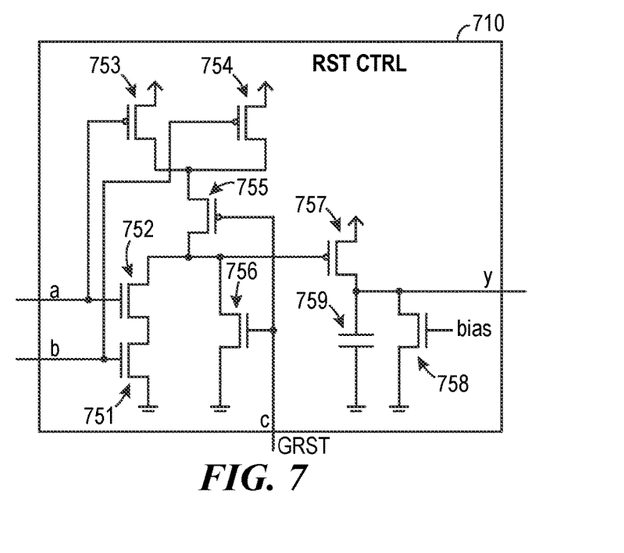

FIGS. 6 and 7 are partial schematic diagrams of reset control circuits 610 and 710, respectively, that can be implemented as the reset control circuit 210 of FIG. 2 in various embodiments of the present technology. Referring first to FIG. 6, the reset control circuit 610 includes an AND logic gate 641, an OR logic gate 642, and a delay element 643. The AND logic gate 641 includes a first input configured to receive the row select signal rsel<i> via the first input (input a) of the reset control circuit 610, and a second input configured to receive the acknowledge signal ack<j> via the second input (input b) of the reset control circuit 610. The OR logic gate 642 includes a first input coupled to an output of the AND logic gate 641, a second input configured to receive the global reset signal GRST via the third input (input c) of the reset control circuit 610, and an output (output x) coupled to an input of the delay element 643. The delay element 643 includes an output coupled to the output (output y) of the reset control circuit 610.

In operation, the reset control circuit 610 is configured to assert the reset signal RST when (a) the global reset signal GRST is asserted or (b) the row select signal rsel<i> and the acknowledge signal ack<j> are asserted together. In other words, the reset control circuit 610 is configured to assert the RST whenever (a) the global reset signal GRST is asserted or (b) a difference signal is readout from the difference circuit 206 of the event driven pixel 220 of FIG. 2 and the difference signal indicates that an event has occurred in the external scene. Otherwise, the reset control circuit 610 outputs the reset signal RST in its unasserted state. As discussed in greater detail below, upon a falling edge of the output (output x) of the OR logic gate 642, the delay element 643 is configured to hold the reset signal RST in an asserted state for a refractory period.

Referring now to FIG. 7, the reset control circuit 710 includes a plurality of transistors (identified individually in FIG. 7 as first through eight transistors 751-758) and a capacitor 759. The first through fourth transistor 751-754 are arranged as a NAND logic gate. More specifically, a source of the first transistor 751 is coupled to ground (e.g., a negative power supply rail or another reference voltage), a drain of the first transistor 751 is coupled to a source of the second transistor 752, and a gate of the first transistor 751 is configured to receive the acknowledge signal ack<j> via the second input (input b) of the reset control circuit 710. A drain of the second transistor 752 is coupled to a drain of the third transistor 753 and to a drain of the fourth transistor 754, and a gate of the second transistor 752 is configured to receive the row select signal rsel<i> via the first input (input a) of the reset control circuit 710. A source of the third transistor 753 is coupled to a supply voltage (e.g., a positive power supply rail or another reference voltage), the drain of the third transistor 753 is coupled to the drain of the fourth transistor 754, and a gate of the third transistor 753 is configured to receive the row select signal rsel<i> via the first input (input a) of the reset control circuit 710. A source of the fourth transistor 754 is coupled to the supply voltage, and a gate of the fourth transistor 754 is configured to receive the acknowledge signal ack<j> via the second input (input b) of the reset control circuit 710.

The seventh transistor 757 of the reset control circuit 710 is arranged as a low-active switch charging the capacitor 759. In particular, a source of the seventh transistor 757 is coupled to the supply voltage, a gate of the seventh transistor 757 is coupled to an output of the NAND logic gate (e.g., to drain of the second transistor 752, to the drain of the third transistor 753, and to the drain of the fourth transistor 754), and a drain of the seventh transistor 757 is coupled to the capacitor 759 and to the output (output y) of the reset control circuit 710. The capacitor 759 is coupled between (a) ground and (b) the drain of the seventh transistor 757 and the output (output y) of the reset control circuit 710.

The fifth transistor 755 and the sixth transistor 756 of the reset control circuit 710 are arranged as pass transistors. More specifically, (a) a source of the fifth transistor 755 is coupled to the drain of the third transistor 753 and to the drain of the fourth transistor 754; (b) a drain of the fifth transistor 755 is coupled to the drain of the second transistor 752 and to the gate of the seventh transistor 757; (c) a source of the sixth transistor 756 is coupled to ground; and (d) a drain of the sixth transistor 756 is coupled to the drain of the second transistor 752, to the drain of the fifth transistor 755, and to the gate of seventh transistor 757. A gate of the fifth transistor 755 and a gate of the sixth transistor 756 are each configured to receive the global reset signal via the third input (input c) of the reset control circuit 710.

The eighth transistor 758 is arranged as a resistive element configured to discharge the capacitor 759 when the low-active switch is released (e.g., when the seventh transistor 757 is turned off). More specifically, a source of the eighth transistor 758 is coupled to ground; a drain of the eighth transistor 758 is coupled to the drain of the seventh transistor 757, to the capacitor 759, and to the output (output y) of the reset control circuit 710; and a gate of the eighth transistor 758 is configured to receive a programmable or trimmable bias voltage. As discussed in greater detail below, the eighth transistor 758 is configured to hold the reset signal RST in an asserted state for a refractory period when the seventh transistor 757 is turned from on to off.

In operation, the reset control circuit 710 functions similar to the reset control circuit 610. In particular, when both the row select signal rsel<i> and the acknowledge signal ack<j> are asserted, the seventh transistor 757 is turned on via the output of the NAND logic gate (formed by the first through fourth transistors 751-754), the capacitor 759 is charged, and the reset signal RST output from the reset control circuit 710 is asserted. In addition, when the global reset signal GRST is asserted, the seventh transistor 757 is turned on via the sixth transistor 756 acting as a pass transistor, the capacitor 759 is charged, and the reset signal RST output from the reset control circuit 710 is asserted. At all other times, the seventh transistor 757 is off, the capacitor 759 is discharged or left uncharged, and the reset signal RST output from the reset control circuit 710 is not asserted.

The capacitor 759 of the reset control circuit 710 is discharged via the eighth transistor 758 when (a) the global reset signal is deasserted after being asserted or (b) either the row select signal rsel<i> or the acknowledge signal ack<j> are deasserted after both the row select signal rsel<i> and the acknowledge signal ack<j> were asserted together. The rate at which the capacitor 759 is discharged via the eighth transistor 758 (a) is dependent upon the programmable bias voltage applied to the gate of the eighth transistor 758 and (b) is negatively correlated with a length of the refractory period during which the reset signal RST is held asserted after the eighth transistor 758 begins discharging the capacitor 759. For example, higher bias voltages can be used for faster discharging of the capacitor 759 via the eighth transistor 758 and therefore for shorter refractory periods. Continuing with this example, lower bias voltages can be used for slower discharging of the capacitor 759 via the eighth transistor 758 and therefore for longer refractory periods.

It is appreciated that the reset control circuit 210 of FIG. 2 may have another schematic configuration in other embodiments of the present technology than the schematic configurations shown in FIGS. 2, 6, and 7, and that the other schematic can selectively reset the event driven pixel 220 based on the row select signal rsel<i>, the acknowledge signal ack<j>, and/or the global reset signal GRST. For example, the reset control circuit 610 of FIG. 6 can lack or omit the delay element (e.g., such that the output (output x) of the OR logic gate 642 is directly connected to the output (output y) of the reset control circuit 610, and/or such that the reset signal RST is deasserted upon the falling edge of the output (output x) of the OR logic gate 642 without a refractory period. As another example, the reset control circuit 710 of FIG. 7 can lack a refractory period after the global reset signal GRST, the acknowledge signal ack<j>, and/or the row select signal rsel<i> are deasserted. As a specific example, the capacitor 759 and/or the eighth transistor 758 of the reset control circuit 710 can be omitted, and/or the bias voltage applied to the gate of the eighth transistor 758 can be set such that the capacitor 759 is quickly (e.g., immediately) discharged.

Figure 8:
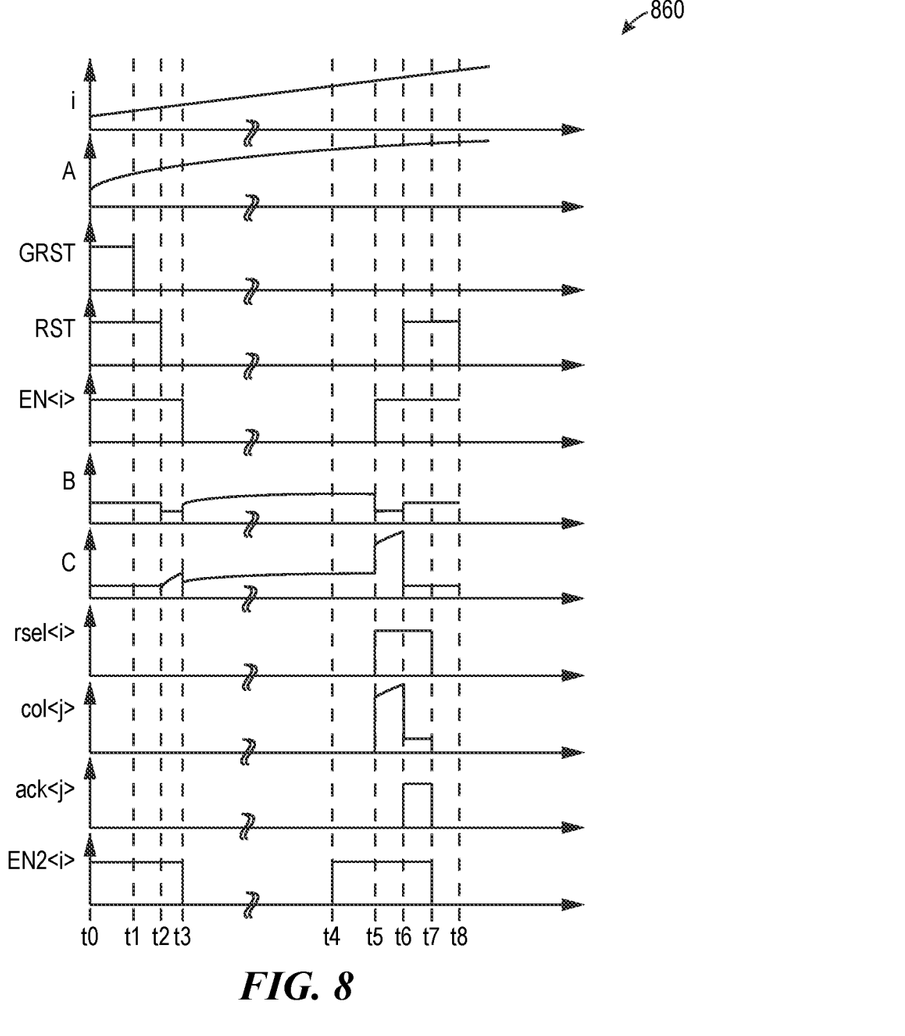
FIG. 8 is a timing diagram illustrating a method of operating an event driven pixel in accordance with various embodiments of the present technology.

FIG. 8 is a timing diagram 860 illustrating a method of operating the event driven pixel 220 of FIG. 2 in accordance with various embodiments of the present technology. Referring to FIGS. 2 and 8 together, photocurrent generated by the photosensor 202 is assumed to be linear (as shown in the top plot of FIG. 8) for the sake of clarity and understanding. In response, the photocurrent-to-voltage converter 204 converts the photocurrent generated by the photosensor 202 into a logarithmically increasing voltage (as shown in the second plot from the top of FIG. 8) that is output at node A of the event driven pixel 220. In other embodiments, the voltage produced by the photocurrent-to-voltage converter 204 can be another function (e.g., linear, square-root, etc.) of the photocurrent generated by the photosensor 202. The second enable signal EN2<i> illustrated in FIG. 8 is not included in the discussion of FIGS. 2 and 8 that follows, but is discussed in detail with reference to FIGS. 10 and 11 below.

At time t0 shown in FIG. 8, the amplifier 224 of the difference circuit 206 is enabled via the enable signal EN<i>, and the global reset signal GRST is asserted to initialize the event driven pixel 220. As the global reset signal GRST is asserted, the reset control circuit 210 of the event driven pixel 220 asserts the reset signal RST applied to the gate of the reset transistor 225. In turn, the reset transistor 225 is turned on, and the output of the amplifier 224 at node C of the event driven pixel 220 is shorted with the input of the amplifier 224 at node B to auto-zero the amplifier 224. Auto-zeroing the amplifier 224 (a) brings a voltage at node B equal to a voltage at node C and (b) sets the voltages at nodes B and C to a mid-potential value that depends on characteristics of the amplifier 224 employed in the event driven pixel 220.

At time t1 shown in FIG. 8, the global reset signal GRST is released, and the reset control circuit 210 maintains the reset signal RST in its asserted state (e.g., using the delay element 643 of FIG. 6 or the eighth transistor 758 of FIG. 7) for a refractory period (shown as the period of time between t1 and t2 in FIG. 8). At time t2, the reset signal RST is unasserted while the amplifier 224 remains enabled (using the enable signal EN<i>) until time t3 to ensure that the logarithmic input voltage at node A is properly sampled as a reference signal or voltage by the difference circuit 206 at time t2 at the end of the refractory period. During the period of time between time t2 (e.g., the end of the refractory period) and time t3 (e.g., the time at which the amplifier 224 is disabled), the feedback between node C and node B of the event driven pixel 220 across the second capacitor C2 223 hinders major voltage swings at node B. Even so, a notable voltage shift may occur at node B due to charge injection during the reset phase. Furthermore, during the period of time between time t2 and time t3, the potential at node C tracks the logarithmic input voltage at node A in an amplified manner.

At time t3, the amplifier 224 is disabled using the enable signal EN<i> (e.g., at the falling edge of the enable signal EN<i>). As the amplifier 224 is disabled, the first capacitor C1 222, the second capacitor C2 223, and a parasitic capacitance Cp at node C can function as a passive AC-coupled voltage divider such that (a) the sensitivity of the potential observed at node B to voltage changes at node A increases and (b) the sensitivity of the potential observed at node C to voltage changes at node A decreases.

At time t5, circuitry peripheral to the event driven pixel 220 asserts the enable signal EN<i> and the row select signal rsel<i> to enable the amplifier 224 and initiate readout of a difference signal onto the column line col<j> via the row select transistor 227. More specifically, after the enable signal EN<i> is asserted, the amplifier 224 settles, and the source follower transistor 226 outputs a difference signal that is dependent on the voltage at node C. The difference signal is an amplified logarithmic difference voltage relative to the initial reset time t2 (e.g., relative to the reference voltage sampled at time t2). Stated another way, the difference signal is a result of a comparison between (a) a reference signal at a gate of the source follower transistor 226 (node C) and (b) the voltage at node A at a moment of assertion of the row select signal rsel<i>. The difference signal is output onto the column line col<j> via the row select transistor 227 in response to assertion of the row select signal rsel<i>.

If circuitry (e.g., the threshold comparison circuit 108 of FIG. 1) peripheral to the event driven pixel 220 detects an event based on the difference signal output onto the column line col<j> (e.g., if a magnitude of the difference signal exceeds a threshold value), an event is triggered and the acknowledge signal ack<j> is asserted at time t6. In response, the reset control circuit 210 asserts the reset signal applied to the gate of the reset transistor 225 to autozero the amplifier 224 and reset the event driven pixel 220. The reset signal RST is subsequently deasserted after a refractory period that starts upon release of either the row select signal rsel<i> or the acknowledge signal ack<j> at time t7. At the end of the refractory period (e.g., at time t8 in FIG. 8), the event driven pixel 220 again samples the logarithmic input voltage at node A using the difference circuit 206 for use as a new reference voltage in a next readout of the event driven pixel 220. As shown in FIG. 8, the amplifier 224 can remain enabled while the event driven pixel 220 samples the logarithmic input voltage at node A at time t8 to ensure the logarithmic input voltage is properly sampled by the difference circuit 206. The amplifier 224 can then be disabled via the enable signal EN<i> sometime after time t8. On the other hand, if circuitry peripheral to the event driven pixel 220 does not detect an event based on the difference signal output onto the column line col<j> between times t5 and time t6, an event is not triggered (meaning that the acknowledge signal ack<j> is not asserted), and the event driven pixel 220 is not reset (absent assertion of the global reset signal GRST) at least until a next readout of the event driven pixel 220. In other words, when an event is not detected based on the difference signal output onto the column line col<j>, the event driven pixel 220 is not reset and the difference circuit 206 continues to produce a difference voltage relative to the reference voltage sampled at time t2. In this manner, the event driven pixel 220 provides low-power detection of events that occur within an external scene.

Figure 9:
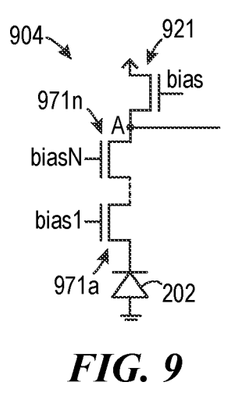
FIGS. 9-11 are partial schematic diagrams of photocurrent-to-voltage converters coupled to photosensors, each configured in accordance with various embodiments of the present technology.
Figure 10:
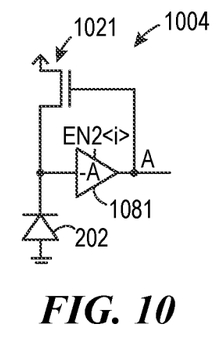
Figure 11:
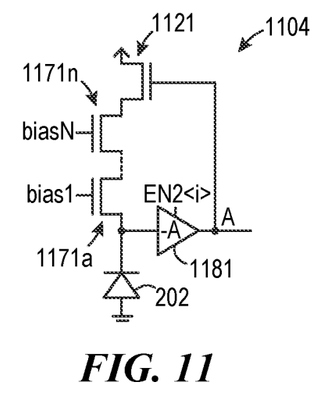

FIGS. 9-11 are partial schematic diagrams of photocurrent-to-voltage converters 904, 1004, and 1104, respectively, configured in accordance with various embodiments of the present technology. The photocurrent-to-voltage converters 904, 1004, and 1104 are each shown coupled to a photosensor 202, and can each be used in the event driven pixel 220 of FIG. 2 in addition to or in lieu of the photocurrent-to-voltage converter 204 illustrated in FIG. 2 to convert photocurrent generated by the photosensor 202 to a voltage.

Referring first to FIG. 9, the photocurrent-to-voltage converter 904 includes a transistor 921 having (a) a drain coupled to a supply voltage (e.g., a positive power supply rail or another reference voltage) and (b) a gate coupled to a bias voltage. The photocurrent-to-voltage converter 904 further includes a plurality of transistors 971 (identified individually in FIG. 9 as first through nth transistors 971a-971n) that are stacked in series with one another. The first transistor 971a of the plurality includes a source coupled to the cathode of the photosensor 202, and the nth transistor 971n of the plurality includes a drain coupled to a source of the transistor 921 and to an output (node A) of the photocurrent-to-voltage converter 904.

As shown, each of the first through nth transistors 971a-971n include a gate configured to receive a corresponding bias voltage. The bias voltages applied to the gates of the first through nth transistors 971a-971n can be identical, or at least some of the bias voltages can vary from one another. The bias voltages applied to the gates of the first through nth transistors 971a-971n can operate the first through nth transistors 971a-971n in weak inversion such that the first through nth transistors 971a-971n provide signal amplification. In other words, the first through nth transistors 971a-971n can be employed to amplify the voltage signal produced at the output (node A) of the photocurrent-to-voltage converter 904.

Referring now to FIG. 10, the photocurrent-to-voltage converter 1004 includes a transistor 1021 having (a) a source coupled to the cathode of the photosensor 202 and (b) a drain coupled to a supply voltage (e.g., a positive power supply rail or another reference voltage). The photocurrent-to-voltage converter 1004 further includes an amplifier 1081 having (a) an input (e.g., an inverting input) coupled to the cathode of the photosensor 202 and to the source of the transistor 1021, and (b) an output coupled to an output (node A) of the photocurrent-to-voltage converter 1004 and to a gate of the transistor 1021. In some embodiments, the amplifier 1081 can be an opamp and/or can include another input (not shown), such as a non-inverting input, that is coupled to ground (e.g., a negative power supply rail or another reference voltage).

The amplifier 1081 can be employed to increase the response speed of a change of the voltage generated at node A between the source and the gate of the transistor 1021. In other words, the amplifier 1081 can be employed in low-latency applications to increase the speed with which the difference circuit 206 of the event driven pixel 220 produces the difference voltage based on the voltage at node C (FIG. 2).

As shown in FIG. 10, the amplifier 1081 is configured to receive an enable signal EN2<i>. The enable signal EN2<i> can be used to selectively enable or disable the amplifier 1081. For example, the enable signal EN2<i> can be used to selectively disable or place the amplifier 1081 in a powered-down mode (thereby reducing power consumption of the event driven pixel 220) at times when the event driven pixel 220 is not sampling a reference signal or outputting a difference signal, and can selectively enable or place the amplifier 1081 in a powered-up mode at times when the event driven pixel 220 is sampling a reference signal or is expected to output a difference signal onto the column line col<j> (e.g., when the row select signal rsel<i> is asserted). In some embodiments, the enable signal EN2<i> can be the enable signal EN<i> of FIG. 2. In other embodiments, the amplifier 1081 may require increased time to settle in comparison to the amplifier 224 of the difference circuit 206 (FIG. 2). In these embodiments, the enable signal EN2<i> can be a separate signal from the enable signal EN<i> such that the enable signal EN2<i> can be asserted (e.g., at time t4 of FIG. 8) before the enable signal EN<i> is asserted (e.g., at time t5 of FIG. 8) to enable the amplifier 1081 and provide the amplifier 1081 additional time to settle before a difference signal is readout from the event driven pixel 220 onto the column line col<j>.

Referring now to FIG. 11, the photocurrent-to-voltage converter 1104 represents a combination of the photocurrent-to-voltage converter 904 of FIG. 9 and the photocurrent-to-voltage converter 1004 of FIG. 10. More specifically, the photocurrent-to-voltage converter 1104 includes a transistor 1121, a plurality of transistors 1171 (identified individually in FIG. 11 as first through nth transistors 1171a-1171n), and an amplifier 1181. The plurality of transistors 1171 are stacked in series with one another. The first transistor 1171a of the plurality includes a source coupled to the cathode of the photosensor 202 and to an input (e.g., an inverting input) of the amplifier 1181. The nth transistor 1171n of the plurality includes a drain coupled to a source of the transistor 1121. The amplifier 1181 includes an output coupled to an output (node A) of the photocurrent-to-voltage converter 1104 and to a gate of the transistor 1121. In some embodiments, the amplifier 1181 can be an opamp and/or can include another input (not shown), such as a non-inverting input, that is coupled to ground (e.g., a negative power supply rail or another reference voltage). The transistor 1121 includes a drain coupled to a supply voltage (e.g., a positive power supply rail or another reference voltage).

Similar to the first through nth transistors 971a-971n of the photocurrent-to-voltage converter 904 of FIG. 9, each of the first through nth transistors 1171a-1171n of FIG. 11 include a gate configured to receive a corresponding bias voltage. The bias voltages applied to the gates of the first through nth transistors 1171a-1171n can be identical, or at least some of the bias voltages can vary from one another. The bias voltages applied to the gates of the first through nth transistors 1171a-1171n can operate the first through nth transistors 1171a-1171n in weak inversion such that the first through nth transistors 1171a-1171n provide signal amplification, as discussed above.

Similar to the amplifier 1081 of the photocurrent-to-voltage converter 1004 of FIG. 10, the amplifier 1181 can be employed to increase the response speed of a change of the voltage generated at node A between the source and the gate of the transistor 1021. In other words, the amplifier 1181 can be employed in low-latency applications to increase the speed with which the difference circuit 206 of the event driven pixel 220 produces the difference voltage based on the voltage at node C (FIG. 2). Additionally, or alternatively, the amplifier 1181 can be configured to receive the enable signal EN2<i> consistent with the discussion of the amplifier 1081 of the photocurrent-to-voltage converter 1004 of FIG. 10 above, to selectively enable or disable the amplifier 1181 (e.g., to reduce power consumption of the photocurrent-to-voltage converter 1104 and therefore of the event driven pixel 220).

C. CONCLUSION

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology as those skilled in the relevant art will recognize. For example, although steps are presented in a given order above, alternative embodiments may perform steps in a different order. Furthermore, the various embodiments described herein may also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where context permits, singular or plural terms may also include the plural or singular term, respectively. In addition, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Furthermore, as used herein, the phrase "and/or" as in "A and/or B" refers to A alone, B alone, and both A and B. Additionally, the terms "comprising," "including," "having," and "with" are used throughout to mean including at least the recited feature(s) such that any greater number of the same features and/or additional types of other features are not precluded. Moreover, as used herein, the phrases "based on," "depends on," "as a result of," and "in response to" shall not be construed as a reference to a closed set of conditions. For example, an exemplary step that is described as "based on condition A" may be based on both condition A and condition B without departing from the scope of the present disclosure. In other words, as used herein, the phrase "based on" shall be construed in the same manner as the phrase "based at least in part on" or the phrase "based at least partially on." Also, the terms "connect" and "couple" are used interchangeably herein and refer to both direct and indirect connections or couplings. For example, where the context permits, element A "connected" or "coupled" to element B can refer (i) to A directly "connected" or directly "coupled" to B and/or (ii) to A indirectly "connected" or indirectly "coupled" to B.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Furthermore, although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

What is claimed is:

1. An event driven pixel, comprising:
    a photosensor configured to generate photocurrent in response to incident light received from an external scene;
    a photocurrent-to-voltage converter coupled to the photosensor to convert the photocurrent to a voltage;
    a difference circuit coupled to the photocurrent-to-voltage converter, wherein the difference circuit includes a source follower transistor, and wherein the difference circuit is configured to (a) generate a reference signal at a gate of the source follower transistor based at least in part on the voltage and (b) output a difference signal from the event driven pixel in response to assertion of a row select signal applied to a row select transistor of the difference circuit, wherein the difference signal is a result of a comparison between (i) the reference signal and (ii) the voltage at a moment of assertion of the row select signal; and
    a reset control circuit coupled to the difference circuit and configured to:
        initialize the difference circuit in response to assertion of a global reset signal applied to the reset control circuit, and
        reset the difference circuit in response to a combination of (a) assertion of the row select signal applied to the reset control circuit and (b) assertion of an acknowledge signal applied to the reset control circuit when the difference signal indicates a change in the voltage greater than a threshold amount.

2. The event driven pixel of claim 1, wherein the difference circuit further includes a filter amplifier having:
    a first capacitor coupled to the photocurrent-to-voltage converter, and
    a second capacitor, an amplifier, and a reset transistor arranged in parallel with one another between the first capacitor and the gate of the source follower transistor.

3. The event driven pixel of claim 2, wherein the amplifier is configured to receive an enable signal to selectively enable the amplifier.

4. The event driven pixel of claim 3, wherein the amplifier includes:
    a current-starved inverter having (a) a first transistor coupling an input of the amplifier to an output of the amplifier and (b) a second transistor;
    the second transistor is driven by a bias potential generated by a matched diode-connected third transistor forming a current mirror; and
    the third transistor includes a drain coupled to a current source.

5. The event driven pixel of claim 4, wherein the amplifier includes:
    a power supply switch component coupled to the current-starved inverter and configured to selectively couple, based at least in part on the enable signal, the second transistor of the current-starved inverter to a first supply voltage and/or to a ground voltage; or
    a switch configured to selectively couple, based at least in part on the enable signal, the second transistor of the current-starved to a second supply voltage.

6. The event driven pixel of claim 4, wherein:
a first switch selectively couples, based at least in part on the enable signal, a gate of the second transistor and a gate of the third transistor to a supply voltage; and
a second switch selectively couples, based at least in part on the enable signal, the drain of the third transistor to the current source.

7. The event driven pixel of claim 2, wherein a gate of the reset transistor is coupled to the reset control circuit to receive a reset signal output from the reset control circuit.

8. The event driven pixel of claim 7, wherein the reset control circuit is configured to assert the reset signal in response to (a) the assertion of the global reset signal or (b) the combination of the assertion of the row select signal and the assertion of the acknowledge signal, and wherein the reset transistor is configured such that assertion of the reset signal shorts an input and an output of the amplifier to one another via the reset transistor.

9. The event driven pixel of claim 1, wherein the reset control circuit includes:
an AND logic gate having a first input configured to receive the row select signal, and a second input configured to receive the acknowledge signal;
an OR logic gate having a first input coupled to an output of the AND logic gate, and a second input configured to receive the global reset signal; and
a delay element having an input coupled to an output of the OR logic gate, and an output coupled to a gate of a reset transistor of the difference circuit.

10. The event driven pixel of claim 1, wherein the reset control circuit includes:
a NAND logic gate having a first input configured to receive the row select signal, and a second input configured to receive the acknowledge signal;
at least one pass transistor coupled to an output of the NAND logic gate and configured to receive the global reset signal;
a capacitor coupled between ground and an output of the reset control circuit;
a low-active switch configured to couple the capacitor to a supply voltage based at least in part on the output of the NAND logic gate, an output of the at least one pass transistor, or a combination thereof; and
a resistive element coupled to the capacitor and configured to (a) receive a bias voltage and (b) discharge the capacitor at a rate based at least in part on the bias voltage.

11. The event driven pixel of claim 1, wherein the photocurrent-to-voltage converter includes:
a first transistor having a drain coupled to a supply voltage and a gate coupled to a first bias potential, and
a plurality of second transistors arranged in series between the photosensor and a source of the first transistor,
wherein each of the second transistors has a gate coupled to a corresponding bias potential, and
wherein the photocurrent-to-voltage converter generates the voltage between the source of the first transistor and an end of the series of the plurality of second transistors opposite the photosensor.

12. The event driven pixel of claim 1, wherein the photocurrent-to-voltage converter includes:
a transistor having a source coupled to the photosensor, and a drain coupled to a supply voltage, and
an amplifier having an input coupled to the photosensor and to the source of the transistor, and an output coupled to a gate of the transistor,
wherein the photocurrent-to-voltage converter generates the voltage at the output of the amplifier.

13. The event driven pixel of claim 12, wherein the amplifier is configured to receive an enable signal to selectively enable the amplifier.

14. The event driven pixel of claim 12,
wherein the transistor is a first transistor,
wherein the photocurrent-to-voltage converter further includes a plurality of second transistors arranged in series between (a) the photosensor and the input of the amplifier and (b) the source of the first transistor, and
wherein each of the second transistors has a gate coupled to a corresponding bias potential.

15. A method of operating an event driven pixel, comprising:
initializing a difference circuit of the event driven pixel, wherein initializing the difference circuit includes asserting a global reset signal applied to a reset control circuit of the event driven pixel that is coupled to the difference circuit;
photogenerating photocurrent with a photosensor in response to receiving incident light from an external scene;
converting the photocurrent to a voltage;
generating, using a source follower transistor of the difference circuit, a difference signal based at least in part on the voltage, wherein the difference signal is a result of a comparison between (i) a reference signal at a gate of the source follower transistor and (ii) the voltage at a moment of assertion of a row select signal;
outputting the difference signal from the event driven pixel in response to assertion of the row select signal; and
resetting the difference circuit in response to a combination of (a) the assertion of the row select signal and (b) assertion of an acknowledge signal applied to the reset control circuit when the difference signal indicates a change in the voltage greater than a threshold amount.

16. The method of claim 15, wherein initializing the difference circuit further includes shorting an input and an output of an amplifier of the difference circuit to one another.

17. The method of claim 15, wherein initializing the difference circuit further includes, in response to assertion of the global reset signal, asserting a reset signal applied to a gate of a reset transistor of the difference circuit.

18. The method of claim 17, further comprising:
deasserting the global reset signal; and
deasserting the reset signal once a refractory period has elapsed after deasserting the global reset signal.

19. The method of claim 18, further comprising generating the refractory period using a delay element of the reset control circuit.

20. The method of claim 18, further comprising generating the refractory period, wherein generating the refractory period includes discharging a capacitor of the reset control circuit using a resistive element of the reset control circuit.

21. The method of claim 15, wherein initializing the difference circuit further includes sampling a reference voltage based at least in part on the voltage.

22. The method of claim 21, wherein the reference voltage is a first reference voltage, the photocurrent is first photocurrent, and the voltage is a first voltage, wherein the method further comprises photogenerating second photocurrent and converting the second photocurrent to a second voltage, and wherein resetting the difference circuit includes sampling a second reference voltage based at least in part on the second voltage.

23. The method of claim 15, further comprising selectively disabling an amplifier of the difference circuit while photogenerating the photocurrent.

24. The method of claim 15, further comprising selectively enabling an amplifier of the difference circuit while outputting the difference signal.

25. The method of claim 15, wherein converting the photocurrent to the voltage includes converting the photocurrent to the voltage using a photocurrent-to-voltage converter of the event driven pixel that is coupled to the photosensor, and wherein the method further comprises selectively disabling an amplifier of the photocurrent-to-voltage converter while photogenerating the photocurrent.

26. The method of claim 15, wherein converting the photocurrent to the voltage includes converting the photocurrent to the voltage using a photocurrent-to-voltage converter of the event driven pixel that is coupled to the photosensor, and wherein the method further comprises selectively enabling an amplifier of the photocurrent-to-voltage converter after initializing the difference circuit and before outputting the difference signal.

27. The method of claim 15, further comprising preventing a reset of the difference circuit when (a) the row select signal is asserted and (b) neither the global reset signal nor the acknowledge signal are asserted.

28. An event driven pixel, comprising:
a photodetector configured to generate photocurrent in response to incident light received from an external scene;
a photocurrent-to-voltage converter coupled to the photodetector and configured to convert the photocurrent to a voltage; and
a difference circuit coupled to the photocurrent-to-voltage converter and including:
an amplifier configured to generate, at least in part, an amplified, analog signal level based at least in part on the voltage, and
a row select transistor configured to output the amplified, analog signal level during readout of the event driven pixel,
wherein the amplifier is configured to receive an enable signal to selectively disable the amplifier (a) after the event driven pixel is initialized or reset and (b) before the amplified, analog signal level is read out of the event driven pixel.

29. The event driven pixel of claim 28,
wherein the enable signal is a first enable signal and the amplifier is a first amplifier,
wherein the photocurrent-to-voltage converter includes a second amplifier having an input coupled to the photodetector and an output coupled to the difference circuit,
wherein the second amplifier is configured to receive a second enable signal to selectively disable the second amplifier (a) after the event driven pixel is initialized or reset and (b) before the amplified, analog signal level is read out of the event driven pixel.

30. The event driven pixel of claim 28, further comprising a reset control circuit coupled to the difference circuit and configured to:
initialize the difference circuit in response to assertion of a global reset signal applied to the reset control circuit; and
reset the difference circuit in response to a combination of (a) the amplified, analog signal level being read out of the event driven pixel and (b) triggering of an event based at least in part of the amplified, analog signal level.

31. An event driven pixel, comprising:
a photosensor configured to generate photocurrent in response to incident light received from an external scene;
a photocurrent-to-voltage converter coupled to the photosensor to convert the photocurrent to a voltage; and
a difference circuit coupled to the photocurrent-to-voltage converter and including (a) a source follower buffer and (b) an amplifier having an input coupled to the photocurrent-to-voltage converter and an output coupled to a gate of the source follower buffer,
wherein the amplifier is configured to receive an enable signal to selectively enable the amplifier,
wherein, at least when the amplifier is enabled via the enable signal, the difference circuit is configured to generate, based at least in part on the voltage, a difference signal that is indicative of whether an event has occurred in the external scene.

32. The event driven pixel of claim 31, further comprising a reset control circuit coupled to the difference circuit and configured to reset the difference circuit in response to a combination of (a) the difference signal being read out of the event driven pixel and (b) triggering of an event signal based at least in part of the difference signal.

\* \* \* \* \*

UNITED STATES PATENT AND TRADEMARK OFFICE
CERTIFICATE OF CORRECTION

PATENT NO. : 12,294,802 B2
APPLICATION NO. : 17/875244
DATED : May 6, 2025
INVENTOR(S) : Andreas Suess et al.

Page 1 of 1

It is certified that error appears in the above-identified patent and that said Letters Patent is hereby corrected as shown below:

In the Claims

In Column 20, Line 65, Claim 5, delete "current-starved" and insert -- current-starved inverter --.

Signed and Sealed this
Twentieth Day of January, 2026

John A. Squires
*Director of the United States Patent and Trademark Office*